(12) United States Patent
Chow (10) Patent No.: US 6,498,746 B1
(45) Date of Patent: Dec. 24, 2002

(54) DISTURBING A FERROELECTRIC MEMORY ARRAY IN A PARTICULAR DIRECTION

(75) Inventor: David GenLong Chow, Los Altos, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/004,972

(22) Filed: Dec. 3, 2001

(51) Int. Cl.[7] .............................................. G11C 11/22
(52) U.S. Cl. ......................... 365/145; 365/65; 365/236
(58) Field of Search ........................ 365/145, 65, 236, 365/117

(56) References Cited

U.S. PATENT DOCUMENTS 5,953,245 A * 9/1999 Nishimura .................. 365/145

* cited by examiner

*Primary Examiner*—David Lam
(74) *Attorney, Agent, or Firm*—Marger Johnson & McCollom, PC (57) ABSTRACT

A method and apparatus for disturbing a ferroelectric memory array in a particular direction. The method counts a number of consecutive memory operations of a same type applied to the array and then determines if the number of consecutive memory operations of the same type exceeds a predetermined threshold. If the number exceeds a predetermined threshold then a disturb operation is performed. A system including a memory system having this capability is also discussed.

21 Claims, 6 Drawing Sheets

DISTURBING A FERROELECTRIC MEMORY ARRAY IN A PARTICULAR DIRECTION

BACKGROUND

1. Field

This disclosure relates to ferroelectric memory arrays, more particularly to methods for managing the polarity properties in the ferroelectric memory array.

2. Background

Ferroelectric memories are typically comprised of a material having ferroelectric properties sandwiched between layers of electrodes. The electrodes are typically arranged in an x-y grid, with each cell of the array being located at the points in the ferroelectric materials where the x and y lines cross over each other. The data bit stored in each cell has a value determined by the polarity of the ferroelectric material at that point. The polarity is controlled by application of voltages on the x and y lines. Typically, the x lines are referred to as word lines and the y lines are referred to as bit lines.

These memory arrays are relatively simple to manufacture, as they only involve two layers of metal and some ferroelectric layer sandwiched between. They typically have high density. Disadvantages lie in the nature of the extraction of data as well as the writing of data to the array. Both of these operations are slow. Reads are destructive and therefore require the data be rewritten to the array. Similarly, in order to write to the array, the array must be cleared. Reading the array with no regard for the output effectively clears the array prior to write operations.

Write operations and read operations are normally accomplished by applying voltages to the word line and bit line of the cell. For example, a read operation may apply a positive voltage from the active word line to the active bit line for a particular cell, and a write operation may apply a negative voltage. After the operation ends, the cell typically returns to its quiescent state with the voltage representing the data value for the bit stored there. Read and write operations disturb the polarity of the cell. If that cell receives a large number of read operations without any write operations, the cell may not return to the proper voltages for that data value but will become slightly disturbed in a particular direction, either positive or negative. The cell has developed a memory, similar to metal fatigue in mechanical devices, also referred to as history dependence.

In order to extend the longevity of ferroelectric memory arrays, then, some form of correction must be instituted that corrects the voltages for the cells without upsetting the actual data value stored in that cell.

BRIEF DESCRIPTION OF THE DRAWINGS

The invention may be best understood by reading the disclosure with reference to the drawings, wherein.

DETAILED DESCRIPTION OF THE EMBODIMENTS

Figure 1:
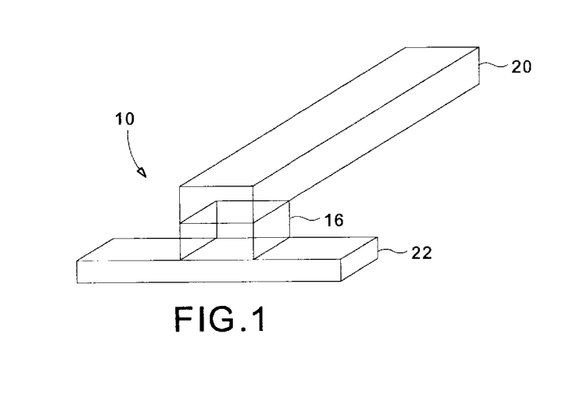
FIG. 1 shows an example of a ferroelectric memory cell.

FIG. 1 shows one example of a cell in a ferroelectric memory array. The cell 10 has an electrode layer 22, a ferroelectric material layer 16 and a second electrode layer 20. This cell may be manufactured by depositing and patterning a layer of metal, spinning on a polymer and then depositing and patterning another layer of metal. There are no transistors or other semiconductor elements in each cell, simplifying both the structure and the manufacturing process of these types of memories.

The electrode layers 20 and 22 are typically organized such that one forms a series of lines oriented in a first direction and the other forms a series of lines in a direction at a right angle to the first direction. Although these lines are separated by the ferroelectric material, they do cross over forming the grid of memory cells. The region of ferroelectric material 16 sandwiched between the two lines at the crossover point shown in FIG. 1 is the portion of the cell that holds the data value as will be discussed in more detail further.

Figure 2:
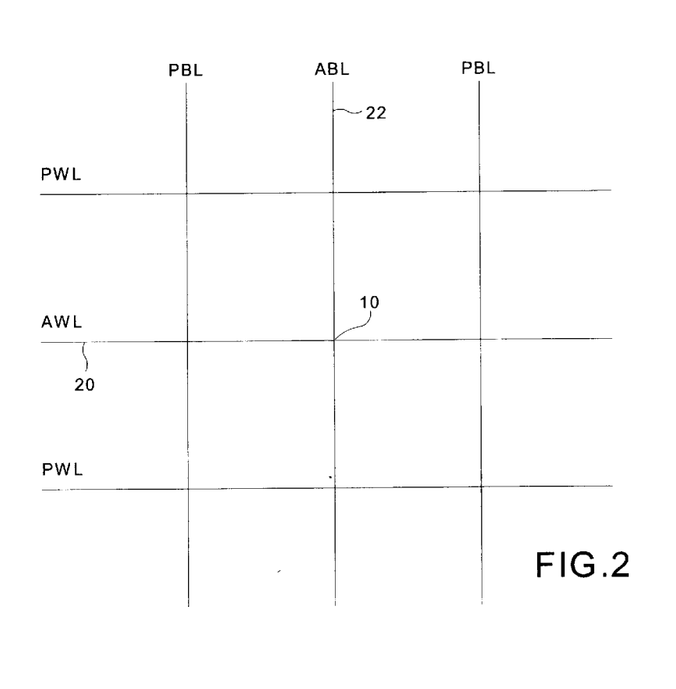
FIG. 2 shows an example of a portion of a ferroelectric memory array.

FIG. 2 shows a portion of a memory array formed of such cells. The electrode line 20 from FIG. 1 is defined as a word line and the electrode line 22 as the bit line. The cell 10 is at the cross over point of these two lines and in this example is the active cell. The active cell for the purposes here is that cell which is being addressed in a memory operation, either a memory read or a memory write. Correspondingly, the word line 20 is defined as the active word line (AWL) and word line 22 is defined as the active bit line (ABL). The word and bit lines surrounding the active cell are referred to as passive word lines (PWL) and passive bit lines (PBL).

Figures 3, 6:
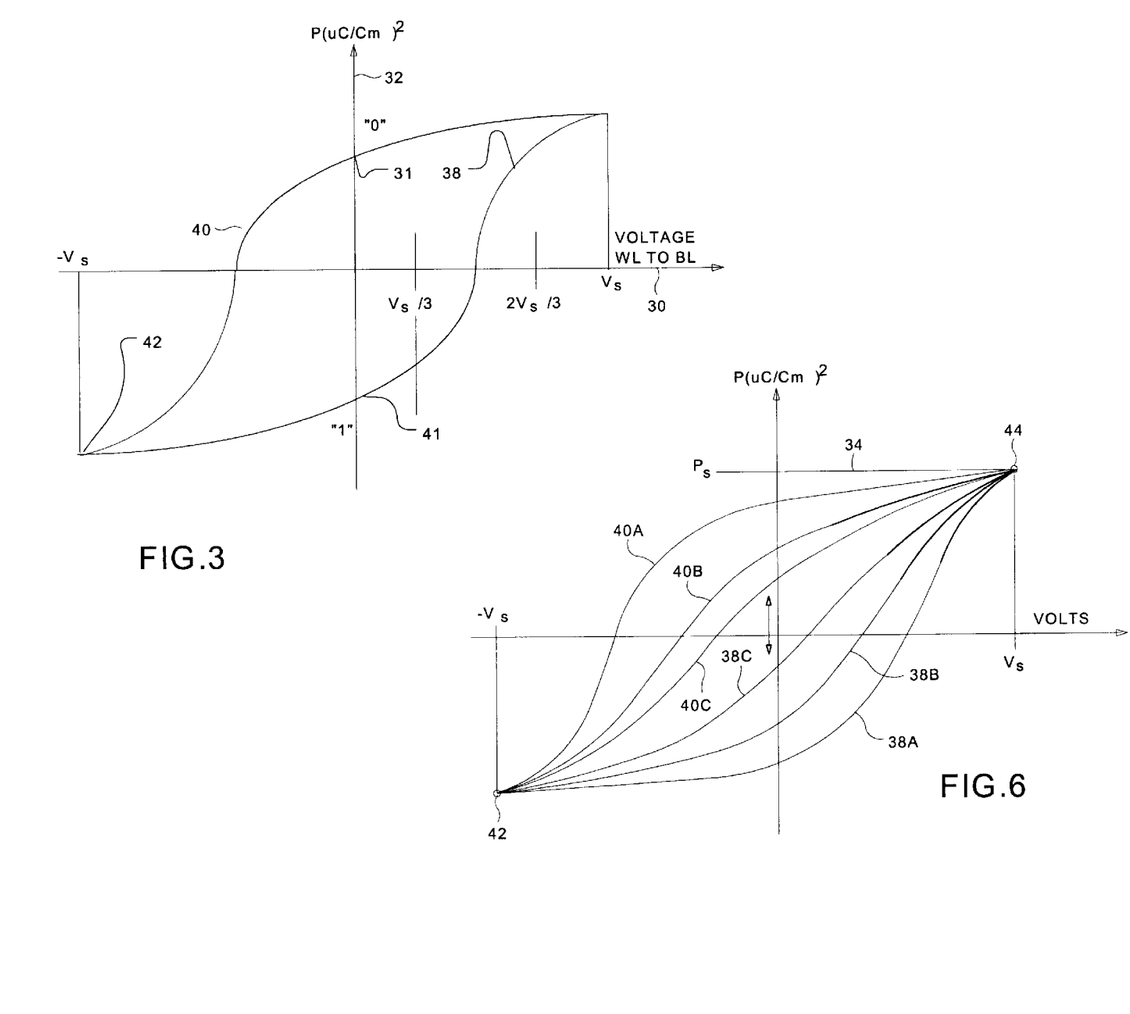
FIG. 3 shows a polarization versus voltage hysterisis curve for a ferroelectric memory cell.
FIG. 6 shows an example of a polarization versus voltage hysterisis curve demonstrating history dependence of a ferroelectric memory cell.

The data value in the cell is either a one '1' or a zero '0'. The value of the cell is determined by the polarization of the material versus the voltage being applied. Referring now to FIG. 3, a polarization versus voltage hysterisis curve demonstrates the nature of the memory cell and how it stores data values of ones or zeros. Control of the voltages applied to the active word line and active bit line may cause the material to experience a polarization shift. The differential voltage seen at the cell is referred to as the word line to bit line voltage, and is shown in the curve of FIG. 3 as the horizontal axis. The vertical axis is the polarization of the material. The origin of the axes corresponds to zero voltage and zero polarization. FIG. 3 shows a typical polarization versus voltage curve.

When a negative voltage $-V_s$ is applied to the word line 20 relative to bit line 22, the polarization versus voltage profile follows the left path 40. This occurs as the polarization of the ferroelectric material switches from positive to negative polarity. Changes in polarization take time and eventually the polarization settles at the polarization level corresponding to the negative saturation voltage $-V_s$, as shown at the bottom of the leftmost path at 42. When the magnitude of the applied voltage is reduced, shown here as being reduced to zero along path 36, the material retains a remanent polarity shown as a data value one on the vertical axis at 41.

Similarly, when a positive saturation voltage $V_s$ is applied to word line 20 relative to bit line 22, the polarization versus voltage profile follows the right side path 38, settling at the polarization level corresponding to the positive saturation voltage, as shown at the top of the rightmost path at 44. When the applied voltage is reduced, shown here as being reduced to zero along path 34, the remnant polarity shown as a data value zero on the vertical axis shown at 31.

In order to determine the current state of polarity of a cell, the saturation voltage $V_s$ is applied to the ferroelectric cell. This means that the word line to bit line voltage differential is $V_s$. This application causes a polarization shift. For the data value zero, where the cell has positive polarity at zero voltage, application of the saturation voltage produces lit to no charge out. Sense amplifiers assigned to that cell detect no charge release. This lack of charge release is then manipulated to produce a data value of 'zero' for that memory cell in the read operation. However, application of the saturation voltage to the cells having negative polarity at zero voltage does cause a polarity reversal and an associated charge release. This charge release is sensed and manipulated to produce a data value of 'one' for that memory cell in the read operation.

Figure 4:
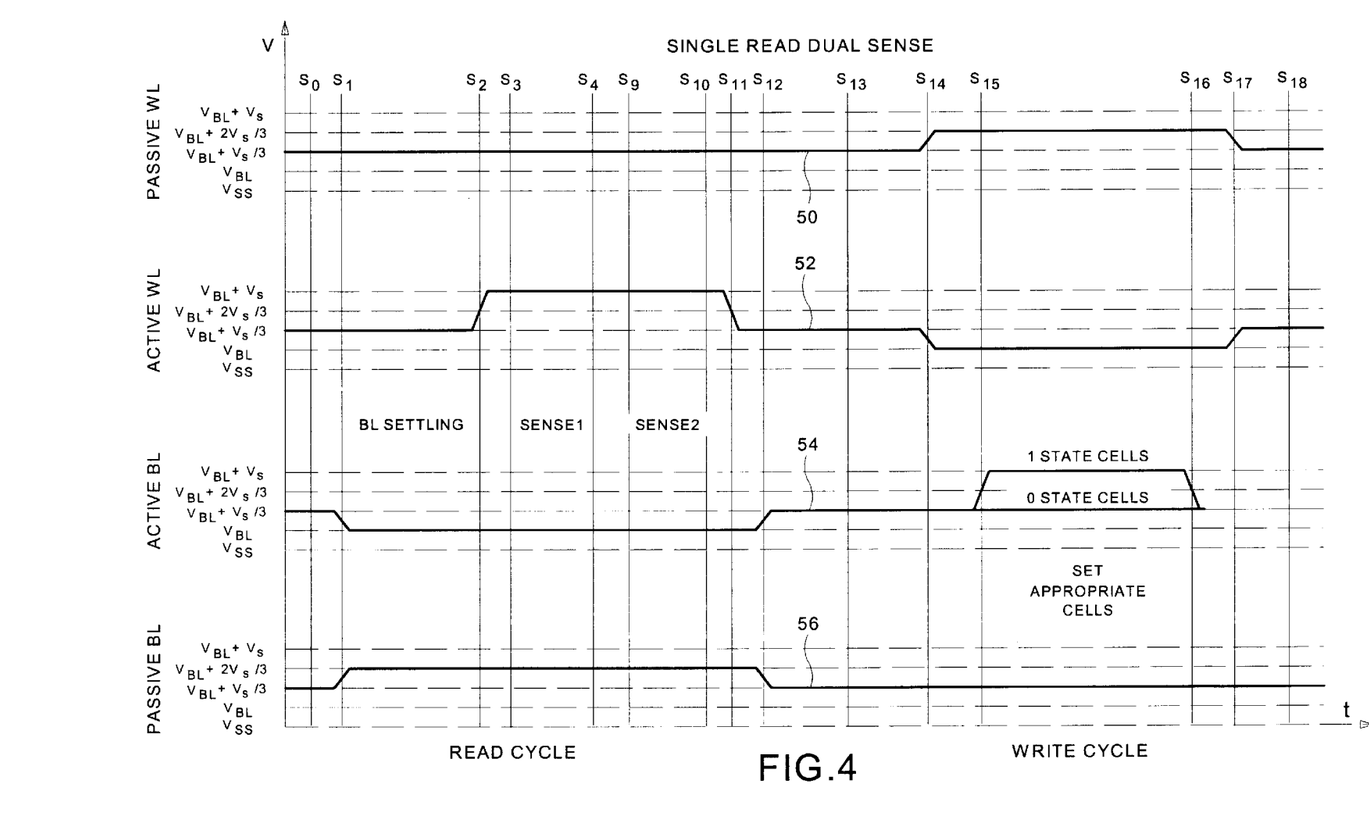
FIG. 4 shows an example of a timing diagram for a read operation on a ferroelectric memory cell.

FIG. 4 shows a timing diagram for one embodiment of a read operation and the associated voltage levels for the word lines and bit lines. Two each of the word lines and bit lines are shown. While only one passive bit line and one passive word line are shown, these are merely representations and it must be understood that all lines not active on the array will have the same voltage levels as the passive word line and passive bit line shown here, for this particular type of read operation. There are several options for performing read and write operations, the following discussion is intended only as an example to promote understanding of the invention and is not intended to limit the scope of the claims in any way.

At time $S_0$, the various word lines and bit lines are at their quiescent voltage of $V_s/3$. Shown in this diagram, the quiescent voltage also has a DC bias applied, $V_{BL}$. This may be applied for several different reasons, including power management or elimination of noise in the power supply and sets the base line voltage for sensing. For purposes of this diagram, the line on the vertical axis marked as $V_{BL}$ corresponds to a zero voltage level, as the applied voltage is zero if the DC bias is ignored. References to voltage levels in this discussion will ignore the bias voltage. For example, a line set at a voltage of $V_{BL}$ will be discussed as a zero voltage, rather than to the bias voltage, for ease of understanding the invention.

At $S_1$, the active bit line (ABL) is brought down to a zero voltage level. The passive bit lines (PBL) are brought to a voltage of 2 $V_s/3$. In this particular embodiment of a read operation, the voltage applied to the active bit lines may cause cells to release a small amount of charge from PWL/AWL to ABL. This charge release over time is referred to as a 'sneak current.' Therefore, a bit line settling time, $T_{BL}$, is provided for allowing the sneak currents to dissipate and reach a steady state.

After the bit line settling time, the saturation voltage, $V_S$, is applied to the active word line at $S_2$. The cells are then read from time segments $S_3$ to $S_{10}$. The operations discussed above are shown on line 52. During the entire course of the read cycle, the passive word lines and passive bit lines have a negative voltage differential of PWL-PWB, of $V_S/3-2V_S/3$, or $-V_S/3$, shown at lines 50 and 56 in FIG. 4. This can be seen more clearly in FIG. 5. Cells are resilient and polarization is not lost at ±V/3 potential across the cells.

Figure 5:
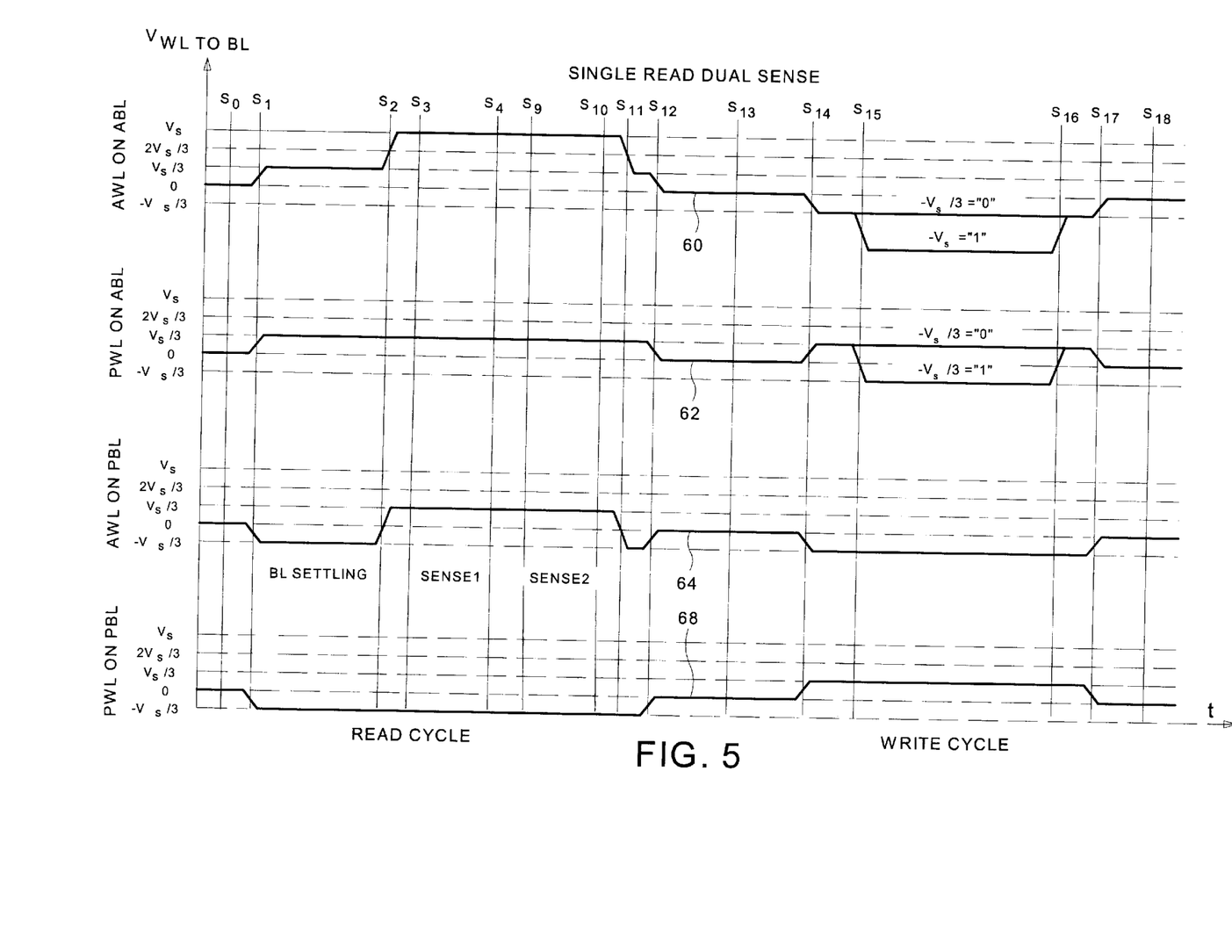
FIG. 5 shows an example of a timing diagram corresponding to a read operation on a ferroelectric memory cell, in accordance with the invention.

FIG. 5 shows a timing diagram of the voltages for each of the elements, PWL, PBL, AWL and ABL, relative to each other. It must be noted that an active word line will cross over a number of passive bit lines. Therefore, a different voltage profile exists for the AWL on PBL shown on line 62. Similarly, a passive word line may cross over an active bit line, leading to another voltage profile for PWL on ABL shown on line 64. Finally, passive word lines will cross over passive bit lines, generating a different voltage relationship of PWL on PBL shown on line 68.

The PWL on PBL portion of the timing diagram in FIG. 5 shows that a negative voltage differential exists from time $S_1$ to $S_{11}$. As discussed above, this negative voltage differential is being applied to those cells that lie at the cross over points of all the passive bit lines and passive word lines. This in and of itself is not a problem.

However, assume that a particular cell is a passive cell, where both the bit line and the word line for that cell are passive, for a large number of read operations. This cell receives a negative voltage in a large number of consecutive read operations. This may cause the memory cell to lose its polarization, also referred to as history dependence. The state of the polarization of that particular cell is dependent upon its previous history. This can be seen more clearly in FIG. 6.

FIG. 6 shows a polarization versus voltage hysterisis curve demonstrating history dependence of ferroelectric memory cells. As mentioned above, FIG. 3 showed the ideal case for the polarization versus voltage. As a reminder, the point 42 on the curve where $-V_S$ is applied causes the cell to have a negative polarity. When $-V_S$ is removed, the voltage is zero so the curve follows the rightmost path as the cell assumes a state corresponding to the data value one. Similarly, application of the positive saturation voltage $V_S$, causes the cell to shift to a positive polarity. When the voltage returns to zero the cell assumes the polarization associated with a data value zero.

As a cell receives a large number of memory operations of a particular type, the cell may lose its polarization charge. The cell polarization becomes affected by its WL-BL history. For example, in the read operation discussed above, the cells having a passive word line to passive bit line relationship would receive a large number of consecutive negative voltages. In this example, the memory operations of a particular type would be passive reads, where the cell is passive for a number of read operations.

Alternatively, the cell could be active, where both the bit line and word line for that cell are both active. A read operation to such a cell is an active read operation. The cell may also be partially passive, where either the bit line or the word line is passive while the other line for that cell is active. The read operation that would cause that condition is referred to as a partial passive read. Corresponding terminology will be used for write operations. A difference with regard to write operations, however, is that the voltage applied for write operations as shown in FIG. 4 would be negative. This causes a positive voltage differential for PWL on PBL as shown in FIG. 5.

Over time, passive cells subjected to large numbers of consecutive same memory operations may fatigue. Generally, after a memory operation, the cell will return to it quiescent one or zero state. But if a large number of operations of the same type occur consecutively, the cell may not return to the same level of polarity as before. As can be seen by the inner curves 38A–38C and 40A–40C of FIG. 6, the differential between the zero data state and the one data state becomes smaller and smaller. At some point, for example, the one data state will no longer release enough charge to be sensed as a one. Similarly, the zero data state with a large remanent polarization may be sensed as a "1."

If a cell is not subjected to a large number of consecutive memory operations of the same type, this problem does not typically occur. For example, if a cell receives several passive read operations and then receives a passive write operation, it will realign itself without incurring actual read and write cycles. Some way to mimic this type of changed operation would allow the cell to realign itself. Generally, these operations will be passive operations, not disturbing the contents of the cells, but disturbing the polarity in one direction or the other to correct the drift. The correcting operations will be referred to as disturb operations.

Figure 7:
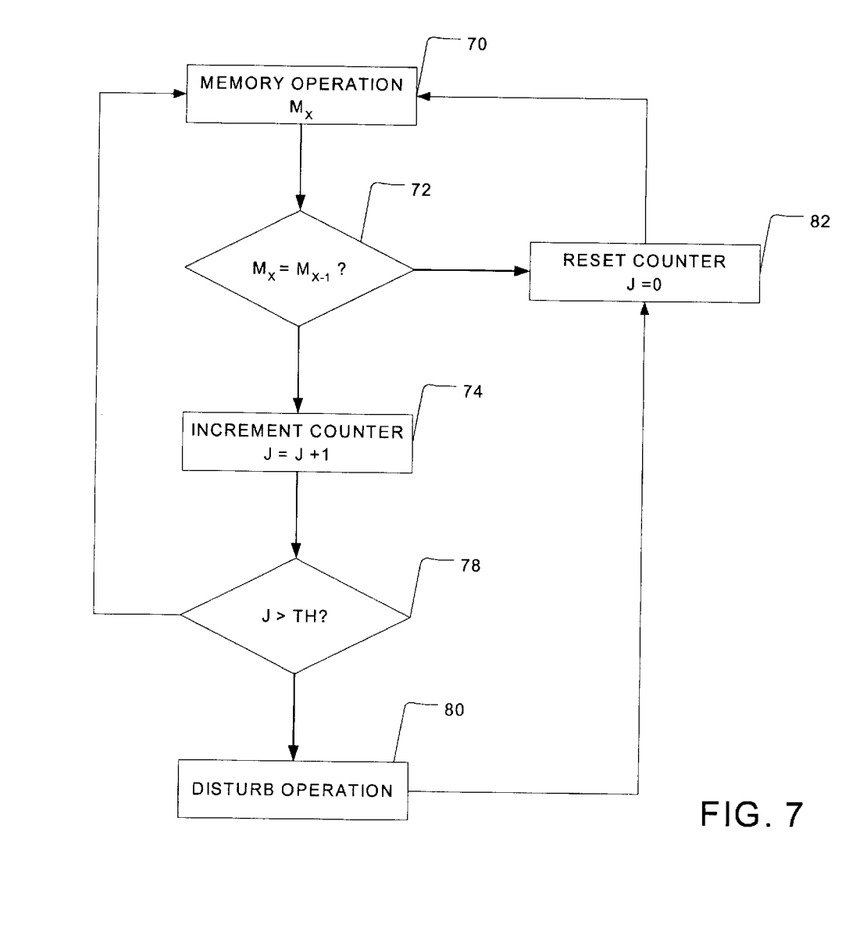
FIG. 7 shows a flowchart of one embodiment of a method for disturbing a ferroelectric memory array in a particular direction, in accordance with the invention.

FIG. 7 shows a flow chart of one embodiment of a method to overcome history dependence in ferroelectric memory cells, in accordance with the invention. A memory operation occurs at 70. For purposes of differentiating between sequential memory operations, the current memory operation will be referred to as $M_x$. $M_x$ is checked to see if it is substantially the same type of memory operation as $M_{x-1}$, at 72. The use of the equal sign in the diagram is merely for convenience. The actual memory operation may vary slightly with regard to polarity, addresses to which it is applied, etc. The check is to determine if it is the same type of operation, such as a passive read or a passive write.

While the above discussion is directed to passive reads and passive writes, it must be understood that other embodiments of ferroelectric memory arrays may have other types of memory operations that cause polarity degradation in the memory cells. There is no limitation on the application of the invention as to a particular type of memory operation.

Read operations cause a counter to increment and write cycles cause it to decrement at 74. The term counter as used here could be any type of circuit, register or other mechanism that tracks occurrences of a given event. At end of each read/write cycle the value of the counter is checked against a positive and a negative threshold determined by the memory material characteristics.

The predetermined threshold may be determined by the system designer, could be programmed into the device after the characteristics of the array are know, or could be adaptive. An adaptive threshold may adjust itself according to a formula or lookup table depending upon the total number of operations that have been performed on the array, or by time, as examples.

The counter exceeding the threshold count indicates that polarization degradation is likely. Therefore, a disturb operation is applied at 80 to correct the polarization. The correction occurs by disturbing the cells of the ferroelectric memory array in a direction opposite of the memory operation that has been applied to the device consecutively for a large number of iterations. For example, if the large number of consecutive, same memory operations were all reads, the disturb operation may be a write, following the example set out above. Once the disturb operation has completed, the counter is reset at 82 and the process resumes.

However, if the counter has not exceeded the threshold at 78, the process resumes with the next memory operation. The next memory operation may result in the counter being incremented or decremented. In this particular embodiment, the system controller has to track and store the type of the previous memory operation.

As discussed above, there were four different types of memory operations in the example. However, for ease of implementation, the number of consecutive operations of the same type may be tracked globally for the entire array. During a read cycle, many cells of the device will receive passive read operations. Tracking the number of read operations, regardless of what cells are affected, and then performing a global disturb seems a simple and effective implementation. This will be referred to as a global disturb and the tracking will be referred to as tracking the global history.

However, in some implementations is may be more effective to track the number of consecutive operations that are the same type for individual cells, individual word lines or individual bit lines. These will be referred to as word line, bit line or cell histories and disturbs. Regardless of whether the tracking is done at the array, word line, bit line or cell level, any memory operation applied to the device will trigger the process discussed above. This implementation would require a higher level of computational intensity and more memory in which to store the histories. The computational intensity required might determine at what level the tracking and disturbing are performed.

Figure 8:
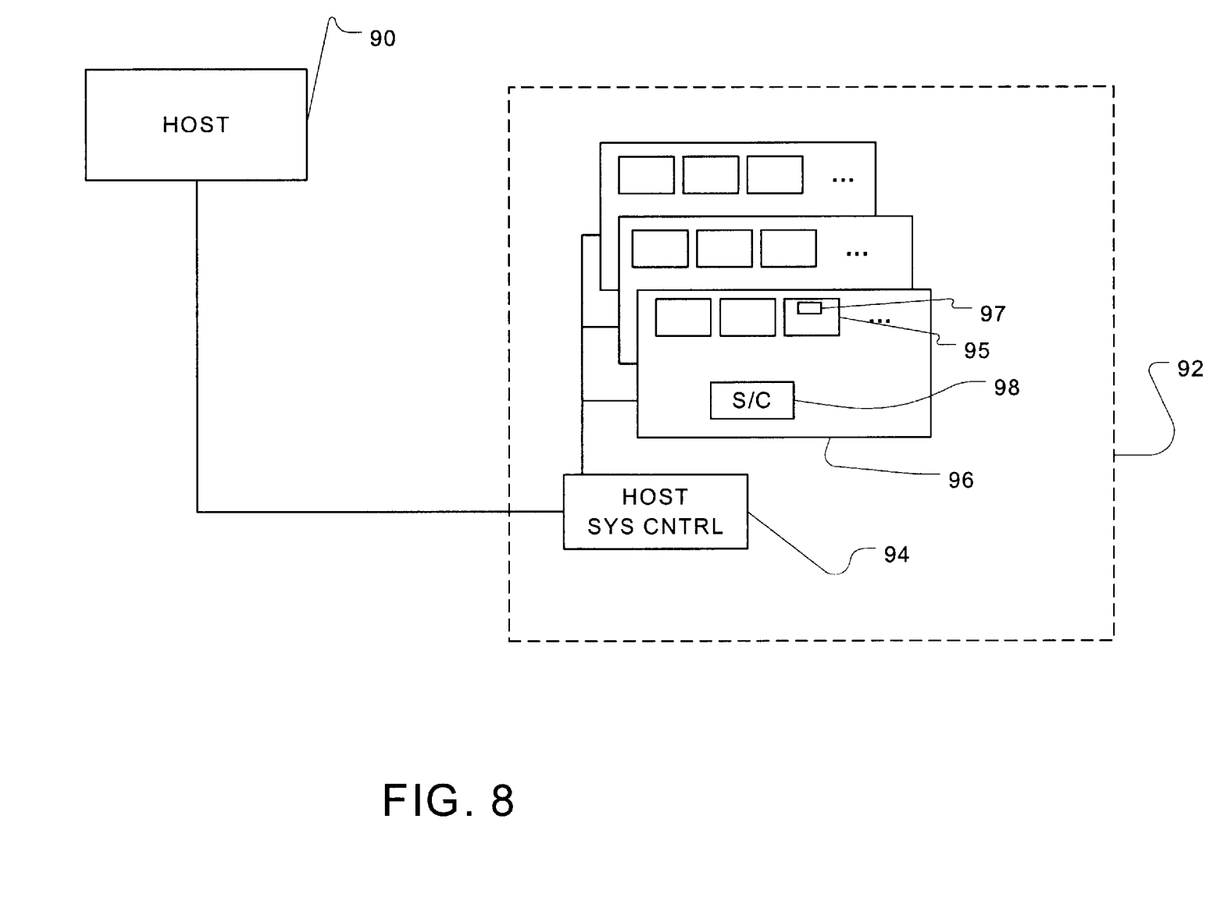
FIG. 8 shows an example of a ferroelectric memory device and system, in accordance with the invention.

FIG. 8 shows one embodiment of a ferroelectric memory system capable of self-correction, in accordance with the invention. At the least complex level, the system may only include a memory device 95. Somewhere on the device would reside a controller 97. The controller 97 would track the number of consecutive operations of the same type and would control the application of the disturb operations.

In a more complex embodiment, the device 95 may reside on a memory card 96. The memory card 96 may have a system controller 98 that tracks the number of consecutive operations of the same type and applies the disturb operation as needed. In an even more complex embodiment, the individual card 96 may reside as part of a memory system 92, with a memory system controller 94. In this embodiment, the system controller 94 would handle the tracking and disturb operations. Finally, a host system 90 may handle control of the system 92 and the track the number of consecutive operations that are the same and apply the disturb operations.

In any of the above embodiments, the tracking may be on a global, or array, level, or on the word line, bit line or cell levels, as discussed above. Similarly, that which tracks the number of consecutive operations that are the same and applies the global disturb as necessary will be referred to as the host. As mentioned above, the host may be on the device as shown at 97, on a card as shown at 98, within a memory system as shown at 94, or external to the entire memory system as shown at 90.

Regardless of where the control of the tracking and disturb functions reside, their application in accordance with this invention will prolong the useful life of the ferroelectric memory arrays. Similarly, it will preserve the data integrity of these arrays and reduce memory errors in systems that employ them.

Thus, although there has been described to this point a particular embodiment for a method and apparatus for disturbing ferroelectric memory arrays in a particular direction, it is not intended that such specific references be considered as limitations upon the scope of this invention except in-so-far as set forth in the following claims.

What is claimed is:

1. A method of disturbing a ferroelectric memory array in a particular direction, the method comprising:

a) counting a number of consecutive memory operations of a same type applied to the array;

b) determining if the number of consecutive memory operations of the same type exceeds a predetermined threshold; and c) performing a disturb operation if the number of consecutive memory operations of the same type exceeds the predetermined threshold.

2. The method of claim 1, wherein the number of consecutive memory operations of a same type are counted for the entire array.

3. The method of claim 1, wherein the number of consecutive memory operations of a same type are counted for each word line in the ferroelectric memory array.

4. The method of claim 1, wherein the number of consecutive memory operations of a same type is counted for each bit line in the ferroelectric memory array.

5. The method of claim 1, wherein the number of consecutive memory operations of a same type are counted for each cell in the ferroelectric memory array.

6. The method of claim 1, wherein the predetermined threshold is determined by the system designer.

7. The method of claim 1, wherein the predetermined threshold depends upon the characteristics of the ferroelectric memory array.

8. The method of claim 1, wherein the predetermined threshold is adaptive.

9. The method of claim 1, wherein the number of consecutive operations of the same type are read operations, and the disturb operation is a write operation.

10. The method of claim 1, wherein the number of consecutive operations of the same type are write operations, and the disturb operation is a read operation.

11. A system include a ferroelectric memory system, comprising:

a) at least one ferroelectric memory array comprising bit lines and word lines; and b) a host operable to count a number of consecutive memory operations of a same type applied to the array and operable to apply a disturb operation to at least the cells adjacent one bit or word line of the array as necessary based on the count.

12. The memory system of claim 11, wherein the host resides on the same device as the ferroelectric memory array.

13. The memory system of claim 11, wherein the host resides on the same memory card as the ferroelectric memory array.

14. The memory system of claim 11, wherein the host is external to the memory system.

15. A memory device, comprising:

a) a ferroelectric memory array;

b) a controller operable to:
  i) count the number of consecutive memory operations of a same type applied to the device; and
  ii) apply a disturb operation as necessary based on the count.

16. The memory device of claim 15, wherein the controller is operable to count the number of consecutive memory operations of a same type for each cell in the array.

17. The memory device of claim 15, wherein the controller is operable to count the number of consecutive memory operations of a same type for each bit line in the array.

18. The memory device of claim 17, wherein the disturb operation is applied only to one bit line based upon the count.

19. The memory device of claim 17, wherein the disturb operation is applied only to one word line based upon the count.

20. The memory device of claim 15, wherein the controller is operable to count the number of consecutive memory operations of a same type for each word line in the array.

21. The memory device of claim 15, wherein the controller is operable to count the number of consecutive memory operations of a same type for the entire array.

* * * * *